United States Patent
Li et al.

(10) Patent No.: US 11,251,242 B2
(45) Date of Patent: Feb. 15, 2022

(54) ARRAY SUBSTRATE, FABRICATION METHOD THEREOF, AND DISPLAY PANEL

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Fei Li, Beijing (CN); Youyuan Hu, Beijing (CN); Mengyu Luan, Beijing (CN); Xinfeng Wu, Beijing (CN); Xinzhu Wang, Beijing (CN); Huihui Li, Beijing (CN)

(73) Assignees: HEFEI XINSHENG OPTOELECTRONICS TECHNOLOGY CO., LTD, Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 506 days.

(21) Appl. No.: 16/334,077

(22) PCT Filed: Aug. 3, 2018

(86) PCT No.: PCT/CN2018/098564
§ 371 (c)(1),
(2) Date: Mar. 18, 2019

(87) PCT Pub. No.: WO2019/144593
PCT Pub. Date: Aug. 1, 2019

(65) Prior Publication Data
US 2021/0327977 A1 Oct. 21, 2021

(30) Foreign Application Priority Data

Jan. 29, 2018 (CN) .......................... 201810088230.6

(51) Int. Cl.
| | | |
|---|---|---|
| *H01L 51/56* | (2006.01) | |
| *H03H 9/21* | (2006.01) | |
| *H01L 27/32* | (2006.01) | |

(52) U.S. Cl.
CPC .......... *H01L 27/3246* (2013.01); *H01L 51/56* (2013.01); *H03H 9/21* (2013.01); *H01L 2227/323* (2013.01)

(58) Field of Classification Search
CPC .................................. H01L 51/56; H03H 9/21
See application file for complete search history.

(56) References Cited

U.S. PATENT DOCUMENTS

| | | | |
|---|---|---|---|
| 10,504,973 B2 * | 12/2019 | Yang | ........................ H01L 51/56 |
| 2012/0135556 A1 * | 5/2012 | Takeuchi | ............ H01L 27/3246 438/34 |

(Continued)

FOREIGN PATENT DOCUMENTS

| | | |
|---|---|---|
| CN | 107104130 A | 8/2017 |
| CN | 107240599 A | 10/2017 |

(Continued)

OTHER PUBLICATIONS

Office Action dated Apr. 3, 2020, issued in counterpart CN Appication No. 201810088230.6, with English translation (9 pages).

(Continued)

*Primary Examiner* — Fernando L Toledo
*Assistant Examiner* — Valerie N Newton
(74) *Attorney, Agent, or Firm* — Westerman, Hattori, Daniels & Adrian, LLP

(57) ABSTRACT

An array substrate is disclosed. The array substrate may include a base substrate (21), a pixel defining layer (22) on the base substrate (21), and a charge generating layer (24) above the pixel defining layer (22). The pixel defining layer (22) may define a plurality of pixel regions. The pixel (Continued)

defining layer (22) may include a plurality of acoustic structures (220), and each of the plurality of acoustic structures (220) may be configured to resonate under an action of an acoustic wave of a threshold frequency to form a slit to disconnect the charge generating layer (24) of two adjacent pixel regions of the plurality of pixel regions.

19 Claims, 9 Drawing Sheets

(56) References Cited

U.S. PATENT DOCUMENTS

| | | | |
|---|---|---|---|
| 2014/0361260 A1* | 12/2014 | Kim | H01L 27/3246 257/40 |
| 2016/0155784 A1 | 6/2016 | Park et al. | |
| 2020/0258959 A1* | 8/2020 | Mao | H01L 51/0026 |
| 2021/0005835 A1* | 1/2021 | Wang | H01L 51/0011 |

FOREIGN PATENT DOCUMENTS

| | | |
|---|---|---|
| CN | 107359263 A | 11/2017 |
| CN | 206774550 U | 12/2017 |
| CN | 108231861 A | 6/2018 |

OTHER PUBLICATIONS

International Search Report dated Oct. 31, 2018, issued in counterpart Application No. PCT/CN2018/098564 (12 pages).

* cited by examiner

Related Art

ARRAY SUBSTRATE, FABRICATION METHOD THEREOF, AND DISPLAY PANEL

CROSS-REFERENCE TO RELATED APPLICATIONS

This application claims benefit of the filing date of Chinese Patent Application No. 201810088230.6 filed on Jan. 29, 2018, the disclosure of which is hereby incorporated in its entirety by reference.

TECHNICAL FIELD

This disclosure relates to a display technology, in particular, to an array substrate, a fabrication method thereof, and a display panel.

BACKGROUND

Organic light emitting diodes (OLED) have been more and more widely used in display technology due to their advantages such as fast response, wide color gamut, and the like. Comparing with a common OLED device, a white organic light emitting diode (WOLED) becomes more popular because of its long service life and high light emitting efficiency. The WOLED device includes an array substrate. The array substrate is provided with a plurality of light emitting units, each of which includes a plurality of light emitting sub-units of different colors. The light emitting sub-units of different colors are coupled in a stacked mode through charge generating layers.

For an existing array substrate of a WOLED device, when a pixel region emits light, the charge generating layer of the pixel region can transmit leaked electrons to the charge generating layers of adjacent pixel regions. As such, the adjacent pixel regions can also be lightened, thereby causing color mixing and impacting the display effect.

BRIEF SUMMARY

Accordingly, one example of the present is an array substrate. The array substrate may include a base substrate, a pixel defining layer on the base substrate, and a charge generating layer above the pixel defining layer. The pixel defining layer may define a plurality of pixel regions. The pixel defining layer may include a plurality of acoustic structures, and each of the plurality of acoustic structures may be configured to resonate under an action of an acoustic wave of a threshold frequency to form a slit to disconnect the charge generating layer of two adjacent pixel regions of the plurality of pixel regions.

In one embodiment, each of the plurality of the acoustic structures may include a groove. In another embodiment, each of the plurality of the acoustic structures may include a tuning fork.

A height of the pixel defining layer may be in a range from approximately 1 μm to approximately 2 μm, and a width of the pixel defining layer may be in a range from approximately 17 μm to approximately 20 μm. A depth of each of the plurality of the acoustic structures may be approximately ½ to approximately ⅘ of the height of the pixel defining layer. Each of the plurality of the acoustic structures may have an opening, and the opening may have a shape of a square, a rhombus, or a circle. A maximum width of the opening may be smaller than or equal to approximately 1 μm.

Each of the plurality of pixel regions may further include a first light emitting layer and a second light emitting layer. The first light emitting layer may be on a side of the charge generating layer facing the base substrate; and the second light emitting layer may be on a side of the charge generating layer opposite from the base substrate.

In one embodiment, the slit is through the first light emitting layer in a thickness direction. In one embodiment, the slit is through the charge generating layer in a thickness direction. In one embodiment, the slit is not through the second light emitting layer in a thickness direction. The threshold frequency may be more than 20 kHz.

Another example of the present disclosure is a display panel. The display panel may include the array substrate according to one embodiment of the present disclosure.

Another example of the present disclosure is a method of fabricating an array substrate. The method may include forming a pixel defining layer including acoustic structures on a base substrate; the pixel defining layer defining a plurality of pixel regions, forming a charge generating layer on the pixel defining layer, and generating resonance in the acoustic structures under an action of an acoustic wave of a threshold frequency to form slits to disconnect the charge generating layer of two adjacent pixel regions of the plurality of pixel regions.

Forming the pixel defining layer including the acoustic structures on the base substrate may include forming a layer of anodes on a base substrate, depositing an insulating film on the layer of anodes, and performing a patterning process on the insulating film to form the pixel defining layer including the acoustic structures.

In one embodiment, before forming the charge generating layer on the pixel defining layer, the method may further include forming a first light emitting layer on the base substrate.

In one embodiment, after forming the charge generating layer on the pixel defining layer, the method may further include forming a second light emitting layer on the charge generating layer.

In one embodiment, after generating resonance in the acoustic structures under the action of the acoustic wave of the threshold frequency, the method may further include forming a cathode on a side of the second light emitting layer opposite from the base substrate. The threshold frequency may be more than 20 kHz.

BRIEF DESCRIPTION OF THE DRAWINGS

The subject matter which is regarded as the disclosure is particularly pointed out and distinctly claimed in the claims at the conclusion of the specification. The foregoing and other objects, features, and advantages of the are apparent from the following detailed description taken in conjunction with the accompanying drawings in which:

DETAILED DESCRIPTION

Figure 1:
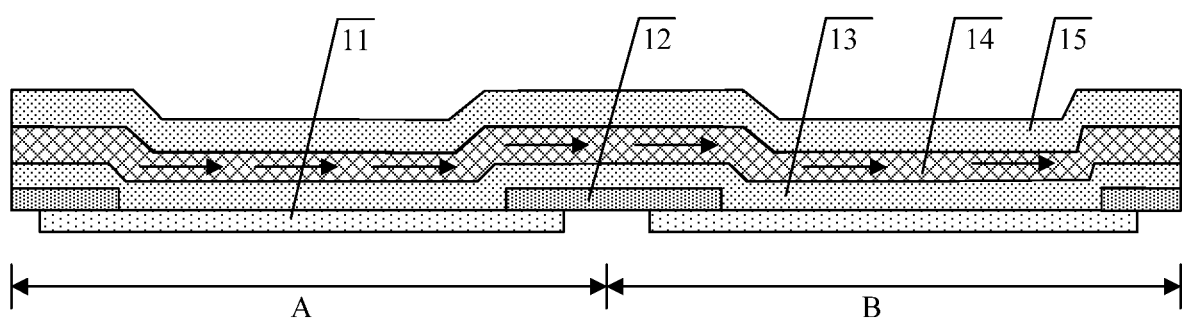
FIG. 1 is a schematic diagram of an existing array substrate in related art.

The present disclosure will be described in further detail with reference to the accompanying drawings and embodiments in order to provide a better understanding by those skilled in the art of the technical solutions of the present disclosure. Throughout the description of the disclosure, reference is made to FIGS. 1-8. When referring to the figures, like structures and elements shown throughout are indicated with like reference numerals.

In the description of the present disclosure, the meaning of "plural" is two or more unless otherwise in some embodiments and in some embodiments defined.

In the description of the specification, references made to the term "one embodiment," "some example embodiments," and "exemplary embodiments," "example," and "specific example," or "some examples" and the like are intended to refer that specific features and structures, materials or characteristics described in connection with the embodiment or example that are included in at least one embodiment or example of the present disclosure. The schematic expression of the terms does not necessarily refer to the same embodiment or example. Moreover, the specific features, structures, materials or characteristics described may be included in any suitable manner in any one or more embodiments or examples.

A numerical range modified by "approximately" herein means that the upper and lower limits of the numerical range can vary by 10% thereof. A number modified by "approximately" herein means that the number can vary by 10% thereof.

Unless otherwise defined, technical terms or scientific terms used in this disclosure should be of ordinary meaning understandable to those of ordinary skill in the art to which this disclosure pertains. The "first," "second," and similar words used in this disclosure do not denote any order, quantity or importance, but only to distinguish between different components. "Including" or "comprising" or similar terms means that the elements or objects preceding the word cover the elements or objects listed after the word and their equivalents, but not excludes other elements or objects. Coupled or connected, and the like are not limited to physical or mechanical connections, but may also include electrical connections, whether direct or indirect. "Up," "down," "left," "right," and so on are used only to represent the relative positional relationship. When the absolute position of the object to be described changes, the relative positional relationship may also change accordingly. When an element such as a layer, a film, a region or a substrate is referred to as being "on" or "under" another element, the element may be "directly" located on or under another element, or there may be an intermediate element.

For an existing array substrate of a WOLED device, when a pixel region emits light, the charge generating layer of the pixel region can transmit leaked electrons to the charge generating layers of adjacent pixel regions. As such, the adjacent pixel regions can also be lightened, thereby causing color mixing and impacting the display effect.

FIG. 1 is a schematic diagram of an existing array substrate in the related art. As shown in FIG. 1, the existing array substrate includes a pixel defining layer 12 configured to separate pixel regions. The pixel regions include an anode 11, a first light emitting layer 13, a charge generating layer 14, and a second light emitting layer 15.

As shown in FIG. 1, when a pixel region A emits light, the charge generating layer 14 at the pixel region A can transmit leaked electrons to the charge generating layer at the adjacent pixel region B. After obtaining the leaked electrons, the charge generating layer at the pixel region B can emit light when the leaked electrons interact with excitons of holes in the second light emitting layer 15 of the pixel region B. As such, the pixel region B can also emit light, thereby causing color mixing of the array substrate and accordingly poor display effect.

In order to avoid color mixing of the array substrate and improve the display effect of the array substrate, an array substrate, a method of fabricating the array substrate, and a display panel are provided according to some embodiments of the present disclosure.

Figure 2:
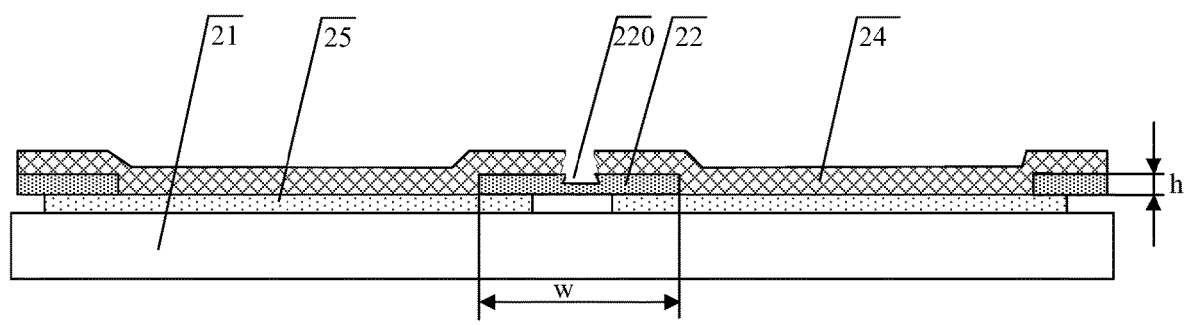
FIG. 2 is a schematic diagram of an array substrate according to some embodiments of the present disclosure.

FIG. 2 is a schematic diagram of an array substrate according to some embodiments of the present disclosure. As shown in FIG. 2, the array substrate includes a base substrate 21 and a pixel defining layer 22 on the base substrate 21. The pixel defining layer 22 defines a plurality of pixel regions. The pixel regions include a charge generating layer 24.

In this embodiment, the pixel defining layer 22 is provided with a plurality of acoustic structures 220. The acoustic structure 220 is configured to resonate under an action of a sound wave of a threshold frequency to form a slit to disconnect the charge generating layer 24 of two adjacent pixel regions.

In some embodiments, the array substrate provided by the embodiments of the present disclosure further includes a layer of anodes 25. The anodes of the adjacent pixel regions are separated. That is, the anodes of the pixel regions are insulated from one another.

The base substrate 21 may be a transparent substrate such as a glass substrate, a plastic substrate, or a quartz substrate which is not limited herein.

The anodes 25 may be made of metal, indium tin oxide, or a mixture of metal and indium tin oxide.

The charge generating layer 24 may be made of a lithium-containing organic or inorganic material.

The pixel defining layer 22 may be made of a photo-polymerizable photosensitive resin or a light-polymerizable photosensitive resin. It may also be made of other insulating materials according to the embodiment of the present disclosure, which are not limited herein.

In the embodiments, the charge generating layer 24 of two adjacent pixel regions is disconnected, that is, the charge generating layer of the adjacent pixel regions are not directly connected from each other. The disconnection here prevents lateral flow of electrons. That is, the disconnection prevents the lateral flow of electrons when a pixel is emitting light. Otherwise, the lateral electron flow would cause adjacent pixels to emit light. Although the charge generating layer of the adjacent pixel regions is still electrically connected, the route of direct lateral flow of electrons is cut off by the slit. The flow of electrons through other paths is very weak, which is not sufficient to cause display failure.

The array substrate provided by the embodiments of the present disclosure includes a base substrate and a pixel defining layer on the substrate. The pixel defining layer defines a plurality of pixel regions. The pixel regions include a charge generating layer. The pixel defining layer is provided with a plurality of acoustic structures. The acoustic structure is configured to resonate under an action of acoustic waves of a threshold frequency. As such, the charge generating layer of the two adjacent pixel regions is disconnected. The charge generating layer of the adjacent pixel regions is disconnected through resonance of the acoustic structures. As such, the lateral leakage current path of the leaked electrons as the pixel region emits light is cut off so that color mixing of the array substrate is avoided, thereby improving the display effect.

Figure 3:
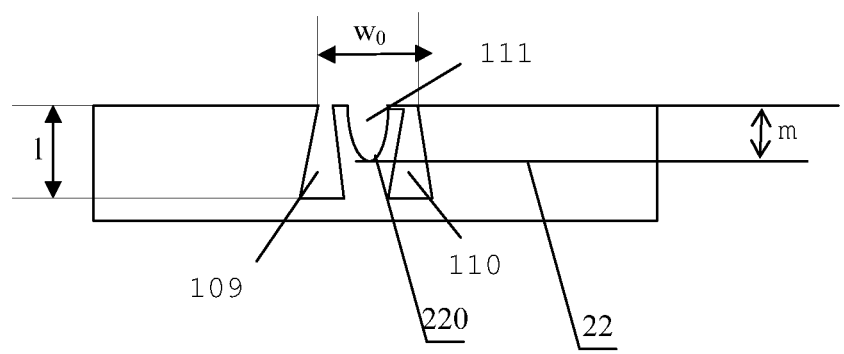
FIG. 3 is a schematic diagram of an acoustic structure according to some embodiments of the present disclosure.
Figure 4:
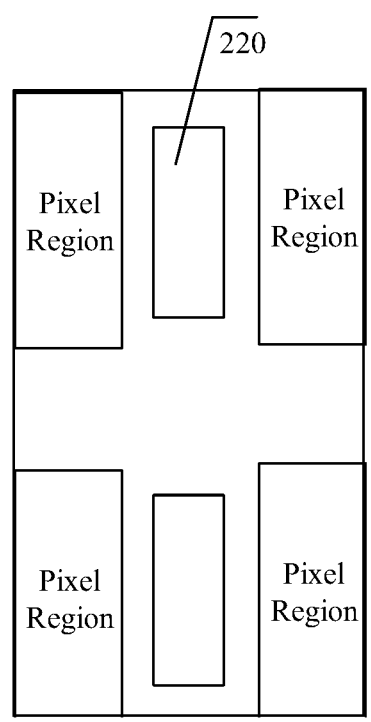
FIG. 4 is a top view of an array substrate according to some embodiments of the present disclosure.
Figure 5:
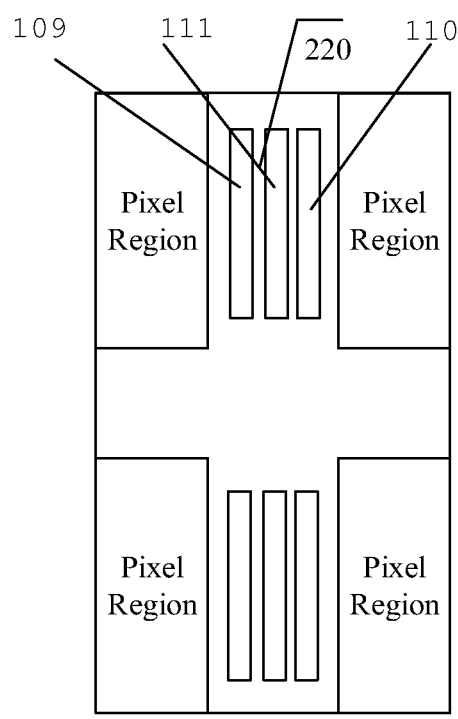
FIG. 5 is a top view of an array substrate according to some embodiments of the present disclosure.

FIG. 3 shows a schematic diagram of an acoustic structure according to some embodiments of the present disclosure. As shown in FIG. 3, the acoustic structure's openings 109 and 110 can be exposed through a weak exposure process, and the tuning fork opening 111 can be exposed through another weak exposure process. The exposure depths l and m can be adjusted according to actual needs. FIG. 4 is a top view of an array substrate according to some embodiments of the present disclosure. As shown in FIG. 4, the acoustic structures 220 can be set in vertical directions. In one embodiment, the acoustic structures 220 can be set in both horizontal and vertical directions. FIG. 5 is a top view of an array substrate according to some embodiments of the present disclosure. As shown in FIG. 5, the shapes of the acoustic structure's openings 109, 110, and the tuning fork opening 111 may be a square structure, but they are not limited to a square structure, but may also be a circle, an ellipse, a rhombus, or the like. All the structures capable of enhancing the sound wave may be used. In one embodiment, the acoustic structure includes a groove or a tuning fork.

FIGS. 2 and 4 show some embodiments in which the acoustic structure is a groove. FIG. 3 and FIG. 5 show some embodiments in which the acoustic structure is a tuning fork. The acoustic structure disclosed by the embodiments of the present disclosure can also be in other shapes as long as the acoustic structure can generate resonance.

In the embodiments, the shape of the acoustic structure is a groove or a tuning fork so that fragments of the film layer can be prevented from being splashed out when the resonance energy is too large.

In some embodiments, the natural frequency of the acoustic structure can be adjusted by adjusting the depth of the groove or the depth of the tuning fork.

In some embodiments, the opening of the acoustic structure may be, but is not limited to, a square shape. The opening of the acoustic structure may also be a circle, an oval, a rhombic, or the like. Any structure being capable of strengthening the sound waves can be used.

In some embodiments, as shown in FIG. 2, the height h of the pixel defining layer is approximately 1 micron to approximately 2 microns. The width w of the pixel defining layer is approximately 17 microns to approximately 20 microns.

In some embodiments, the maximum width of the opening of the acoustic structure 220 w0 is smaller than or equal to approximately 1 micron. The depth, l, is approximately ½ to approximately ⅘ of the height of the pixel defining layer.

Figure 6:
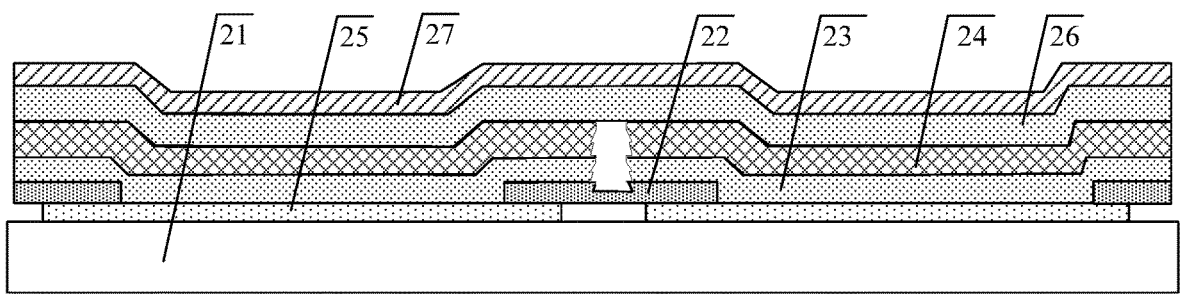
FIG. 6 is a schematic diagram of an array substrate according to some embodiments of the present disclosure.

FIG. 6 is a schematic diagram of an array substrate according to some embodiments of the present disclosure. As shown in FIG. 6, the pixel region provided by the embodiments of the present disclosure further includes a first light emitting layer 23 and a second light emitting layer 26.

The first light emitting layer 23 is arranged at a side of the charge generating layer 24 facing the base substrate 21. The second light emitting layer 26 is arranged at a side of the charge generating layer 24 opposite from the base substrate 21.

In some embodiments, that the first light emitting layers 23 of the adjacent pixel regions are disconnected means that they are insulated from each other.

In some embodiments, the second light emitting layers 26 of the adjacent pixel regions are disconnected. FIG. 6 shows an example that the second light emitting layers of two adjacent pixel regions are connected. The second light emitting layer of the two adjacent pixel regions may also be disconnected. That is, the second light emitting layers of the two adjacent pixel regions may be disconnected from each other or can also be connected, which is not limited herein.

In some embodiments, as shown in FIG. 6, the array substrate provided by the embodiments of the present disclosure further includes a layer of cathodes 27.

Specifically, the cathodes 27 of two adjacent pixel regions are not disconnected.

The cathode 27 may be made of a metal material such as aluminum, and the material thereof not limited herein.

It should be noted that, in the array substrate mentioned above, each of the pixel regions includes an anode, a first light emitting layer, a charge generating layer, a second light emitting layer, and a cathode. When a pixel region is lightened, a side of the charge generating layer closer to the first light emitting layer is equivalent to a cathode. The cathode transmits electrons to the first light emitting layer. The anode transmits holes to the first light emitting layer. Holes and electrons are combined in the first light emitting layer so that the first light emitting layer emits light. A side of the charge generating layer closer to the second light emitting layer is equivalent to an anode. The anode transmits holes to the second light emitting layer. The cathode emits electrons to the second light emitting layer. The holes and the electrons are combined in the second light emitting layer, so that the second light emitting layer emits light. Light emitted by the first light emitting layer and the second light emitting layer is mixed. As a result, light is emitted by the pixel regions.

Figure 7:
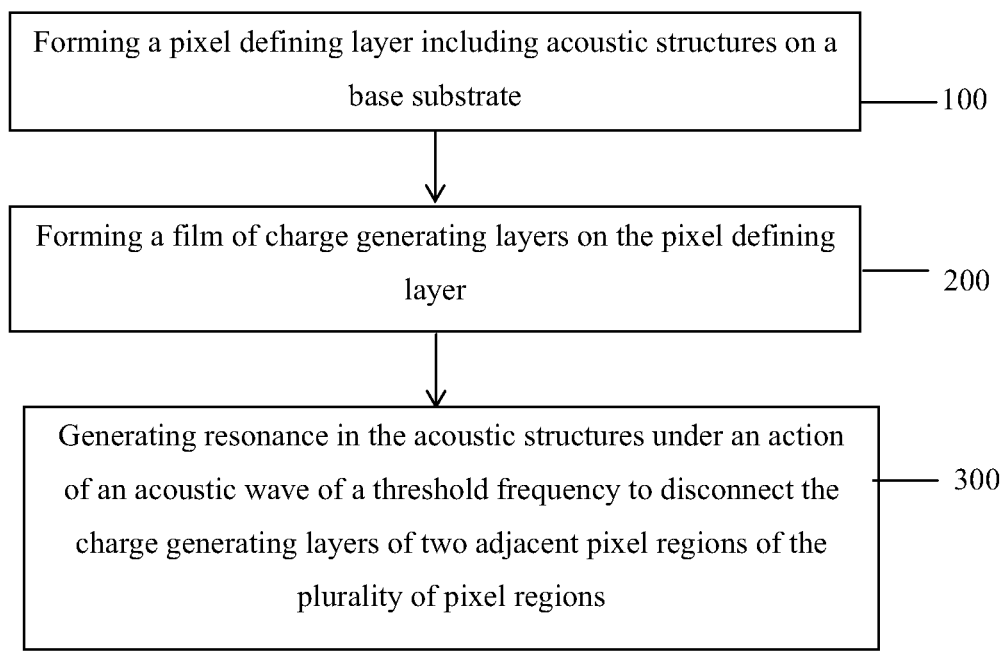
FIG. 7 is a flowchart of a method of fabricating an array substrate according to some embodiments of the present disclosure.

Based on the same inventive concept, FIG. 7 is a flow chart of a method of fabricating an array substrate according to some embodiments of the present disclosure. As shown in FIG. 7, the method of fabricating the array substrate includes the following steps:

In step 100, a pixel defining layer provided with acoustic structures is formed on a base substrate.

Specifically, the pixel defining layer defines a plurality of pixel regions.

The base substrate 21 may be a glass substrate or other transparent substrates. It is not limited herein.

In some embodiments, step 100 includes the following steps:

A layer of anodes is formed on a base substrate. An insulating film is deposited on the layer of anodes. A patterning process is performed on the insulating film to form a pixel defining layer with acoustic structures.

The step that the layer of anodes is formed on the base substrate includes depositing a conductive thin film on the base substrate and forming a layer of anodes through a patterning process.

The anode may be made of metal, indium tin oxide or a mixture of metal and indium tin oxide.

In one embodiment, the pixel defining layer is formed by a patterning process using a halftone mask plate.

The insulating film may be made of a photo-polymerizable photosensitive resin or a light-polymerizable photosensitive resin. It may also be made of other insulating materials, which are not limited herein.

In step 200, a charge generating layer is formed on the pixel defining layer.

The charge generating layer may be made of a lithium-containing organic or inorganic material.

In step 300, the acoustic structures resonate under an action of an acoustic wave of a threshold frequency to form slits, so that the charge generating layer of two adjacent pixel regions is disconnected.

In some embodiments, sound waves or ultrasonic waves of a threshold frequency are emitted through an acoustic apparatus.

The acoustic apparatus may be arranged on a side of the acoustic structure of the pixel defining layer opposite from the base substrate. The acoustic apparatus can emit sound waves or ultrasonic waves, and the acoustic apparatus may also have a limiting opening. The limiting opening can be configured to limit the sound wave to a direction and be transmitted in a certain range. In addition, the frequency of the ultrasonic wave is larger than 20 kHz. It is a form of energy that can interact with a medium to influence or destroy structure of the latter. Generally, the wavelength of an ultrasonic wave is short. The heights of the first light emitting layer and the charge generating layer are multiple times longer than the wavelength of the ultrasonic wave. As such, the ultrasonic wave diffraction is very poor and the ultrasonic wave can be transmitted along a straight line in the medium. That is, the ultrasonic wave can transmit in a certain direction. Therefore, it is possible to consider only the effect of the organic films in the direction of the acoustic wave, and it is believed that the ultrasonic wave has little or no effect on the films outside the straight line region.

Specifically, the natural frequency of the acoustic structure can be obtained through a detection instrument. In the embodiments of the present disclosure, the threshold frequency of the acoustic apparatus is close to the natural frequency of the acoustic structure so that the acoustic wave resonates in the acoustic structure based on the principle that close frequencies of two objects generate resonance. The resonance energy breaks the film of the charge generating layer and accordingly disconnects the direct electron transmission path of adjacent pixel regions.

The method of fabricating the array substrate provided by the embodiments of the present disclosure includes the following:

A pixel defining layer provided with acoustic structures is formed on a base substrate. The pixel defining layer defines a plurality of pixel regions. A charge generating layer is formed on the pixel defining layer. The acoustic structure generates resonance under an action of an acoustic wave of a threshold frequency to form a slit so that the charge generating layer of two adjacent pixel regions is disconnected. According to the embodiments of the present disclosure, the acoustic structures are arranged in the pixel defining layer. The charge generating layer of the adjacent pixel regions is disconnected through the resonance action of the acoustic structures. As such, when the pixel region emits light, the lateral leakage current path of the leaked electrons is cut off by the slit, thereby avoiding color mixing phenomena of the array substrate. Accordingly, the display effect is improved.

In some embodiments, before the step 200, the method of fabricating the array substrate includes a step of forming a first light emitting layer on the substrate.

Specifically, the first light emitting layer of adjacent pixel regions is disconnected.

In some embodiments, after the step 200, the method of fabricating the array substrate further includes a step of forming a second light emitting layer on the charge generating layer.

Specifically, the second light emitting layer of the adjacent pixel regions can be disconnected or connected, which is not limited herein.

Specifically, the step mentioned above can occur before the step 300 or after the step 300, which is not limited herein.

In some embodiments, after the step 300, the method of fabricating the array substrate further includes a step of forming a cathode at a side of the second light emitting layer opposite from the base substrate.

Specifically, a conductive thin film is deposited on the second light emitting layer. The cathode is formed through a patterning process. Cathodes of adjacent pixel regions are connected.

FIGS. 8A-8E is a schematic flow diagram of a method of fabricating the array substrate provided by some embodiments of the present disclosure. The patterning process includes the following steps: coating photoresist, exposing, developing, etching, stripping photoresist, and the like.

Figure 8A:
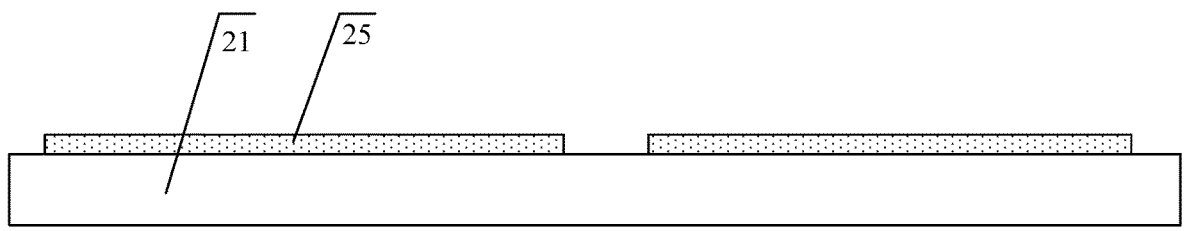
FIGS. 8A-8E show a schematic flow diagram of a method of fabricating an array substrate according to some embodiments of the present disclosure.

In step 410, as shown in FIG. 8A, a base substrate 21 is provided. A layer of anodes 25 is formed on the base substrate 21.

In some embodiments, step 410 includes depositing a conductive thin film on the base substrate 21 and forming a layer of anodes 25 arranged in an array through a patterning process.

The base substrate 21 may be made of a transparent substrate such as a glass substrate, a plastic substrate, a quartz substrate, which is not limited herein.

The conductive film may be made of a metal film, an indium tin oxide thin film or a thin film of a mixture of the metal and the indium tin oxide.

Figure 8B:
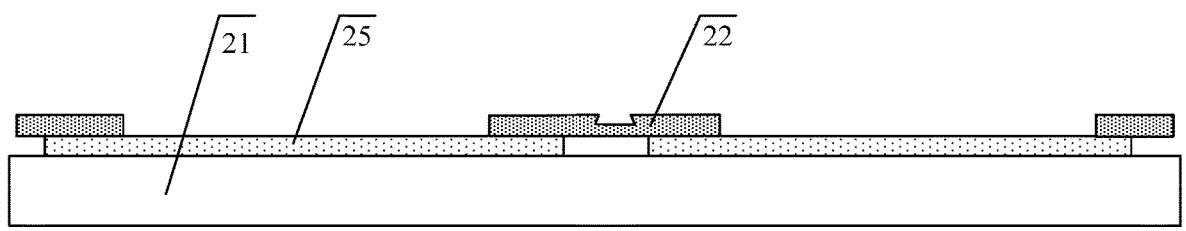

In step 420, as shown in FIG. 8B, a pixel defining layer 22 with acoustic structures are formed on the layer of anodes 25.

In some embodiments, step 420 includes depositing a photo-polymerizable photosensitive resin or a light-polymerizable photosensitive resin on the anodes and forming a pixel defining layer through a semi-mask plate patterning process.

Figure 8C:
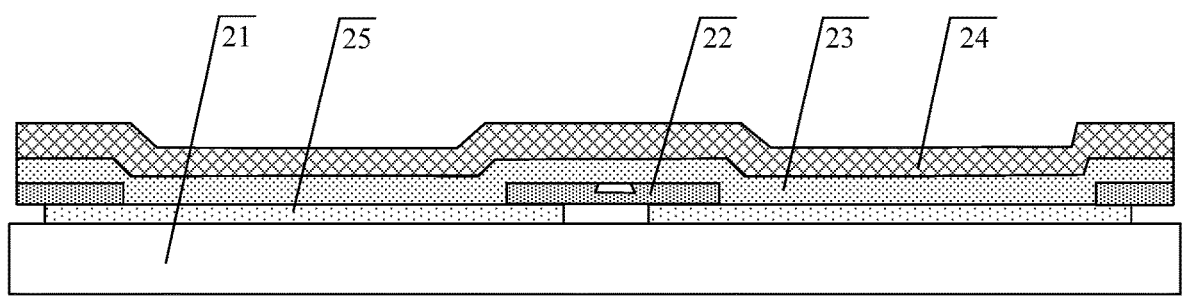

In step 430, as shown in FIG. 8C, a first light emitting layer and a charge generating layer are sequentially formed on the pixel defining layer 22.

In some embodiments, step 430 includes depositing a first light emitting layer on the pixel defining layer and depositing a charge generating layer on the first light emitting layer.

The charge generating layer may be made of a lithium-containing organic or inorganic material.

Figure 8D:
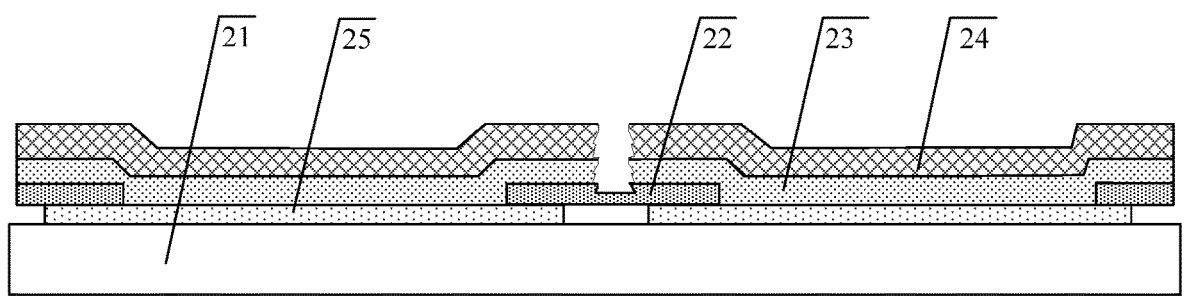

In step 440, the acoustic structures generate resonance under an action of a sound wave of a threshold frequency. As such, as shown in FIG. 8D, both the first light emitting layer and the charge generating layer of two adjacent pixel regions are disconnected.

Figure 8E:
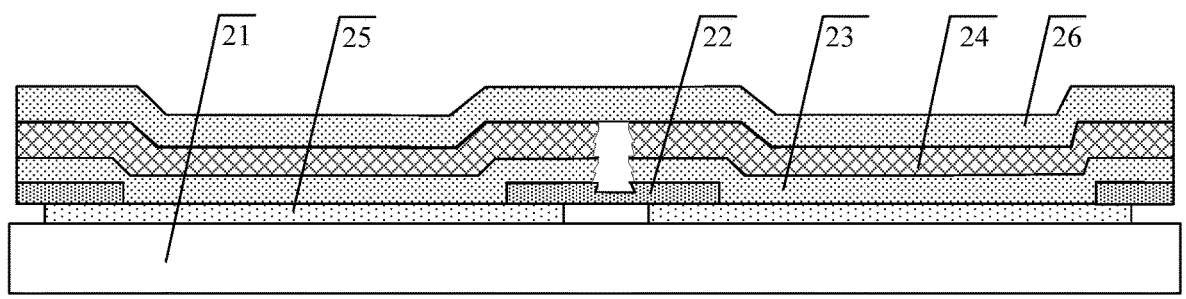

In step 450, as shown in FIG. 8E, a second light emitting layer 26 is formed on the charge generating layer 24.

In some embodiments, the second light emitting layer 26 of adjacent pixel regions in this step is connected. This step can also occur before the step 440.

In some embodiments, the second light emitting layer of two adjacent pixel regions is disconnected.

In step 460, as shown in FIG. 6, cathodes 27 are formed on a side of the second light emitting layer 26 opposite from the base substrate 21.

In some embodiments, a conductive thin film is deposited on the second light emitting layer 26. The cathodes 27 are formed through a patterning process. Cathodes 27 of adjacent pixel regions are connected.

The conductive thin film may be made of an aluminum thin film.

Based on the inventive concept of the above embodiments, a display panel is provided according to some embodiments of the present disclosure. The display panel includes an array substrate provided by the embodiments of the present disclosure. The implementation principle and effect of the display panel are similar to those of the array substrate, and the description thereof is not repeated herein.

The drawings of the embodiments of the present disclosure only relate to the structure of the embodiments of the present disclosure. Other structures can be referred to general designs.

For clarity, in the drawings describing embodiments of the present disclosure, the thickness and size of the layers or the microstructures are amplified. In the disclosure, unless explicitly stated and defined otherwise, when the first feature is "on" the second feature or "under" the second feature, the two features can be in direct contact or indirect contact through an intermediate medium.

Under a condition of no conflict, according to the embodiments of the present disclosure, the features in the embodiments can be combined with one another to obtain new embodiments.

The principle and the embodiment of the present disclosures are set forth in the specification. The description of the embodiments of the present disclosure is only used to help understand the method of the present disclosure and the core idea thereof. Meanwhile, for a person of ordinary skill in the art, the disclosure relates to the scope of the disclosure, and the technical scheme is not limited to the specific combination of the technical features, and also should covered other technical schemes which are formed by combining the technical features or the equivalent features of the technical features without departing from the inventive concept. For example, technical scheme may be obtained by replacing the features described above as disclosed in this disclosure (but not limited to) with similar features.

What is claimed is:

1. An array substrate comprising:
   a base substrate;
   a pixel defining layer on the base substrate, the pixel defining layer defining a plurality of pixel regions; and
   a charge generating layer above the pixel defining layer;
   wherein the pixel defining layer includes a plurality of acoustic structures, and each of the plurality of acoustic structures is configured to resonate under an action of an acoustic wave of a threshold frequency to form a slit to disconnect the charge generating layer of two adjacent pixel regions of the plurality of pixel regions.

2. The array substrate according to claim 1, wherein each of the plurality of the acoustic structures comprises a groove.

3. The array substrate according to claim 1, wherein each of the plurality of the acoustic structures comprises a tuning fork.

4. The array substrate according to claim 1, wherein a height of the pixel defining layer is in a range from approximately 1 μm to approximately 2 μm, and a width of the pixel defining layer is in a range from approximately 17 μm to approximately 20 μm.

5. The array substrate according to claim 4, wherein a depth of each of the plurality of the acoustic structures is approximately ½ to approximately ⅘ of the height of the pixel defining layer.

6. The array substrate according to claim 1, wherein each of the plurality of the acoustic structures has an opening, and the opening has a shape of a square, a rhombus, or a circle.

7. The array substrate according to claim 6, wherein a maximum width of the opening is smaller than or equal to approximately 1 μm.

8. The array substrate according to claim 1, wherein each of the plurality of pixel regions further comprises a first light emitting layer and a second light emitting layer;
   the first light emitting layer is on a side of the charge generating layer facing the base substrate; and
   the second light emitting layer is on a side of the charge generating layer opposite from the base substrate.

9. The array substrate according to claim 8, wherein the slit is through the first light emitting layer in a thickness direction.

10. The array substrate according to claim 8, wherein the slit is through the charge generating layer in a thickness direction.

11. The array substrate according to claim 8, wherein the slit is not through the second light emitting layer in a thickness direction.

12. The array substrate according to claim 1, wherein the threshold frequency is more than 20 kHz.

13. A display panel, comprising the array substrate according to claim 1.

14. A method of fabricating an array substrate, comprising:
   forming a pixel defining layer including acoustic structures on a base substrate; the pixel defining layer defining a plurality of pixel regions;
   forming a charge generating layer on the pixel defining layer;
   generating resonance in the acoustic structures under an action of an acoustic wave of a threshold frequency to form slits to disconnect the charge generating layer of two adjacent pixel regions of the plurality of pixel regions.

15. The method according to claim 14, wherein forming the pixel defining layer including the acoustic structures on the base substrate comprises:
   forming a layer of anodes on a base substrate;
   depositing an insulating film on the layer of anodes; and
   performing a patterning process on the insulating film to form the pixel defining layer including the acoustic structures.

16. The method according to claim 14, wherein, before forming the charge generating layer on the pixel defining layer, the method further comprises:
   forming a first light emitting layer on the base substrate.

17. The method according to claim 13, wherein, after forming the charge generating layer on the pixel defining layer, the method further comprises:
   forming a second light emitting layer on the charge generating layer.

18. The method according to claim 13, wherein, after generating resonance in the acoustic structures under the action of the acoustic wave of the threshold frequency, the method further comprises:
   forming a cathode on a side of the second light emitting layer opposite from the base substrate.

19. The method according to claim 14, wherein the threshold frequency is more than 20 kHz.

* * * * *